(12) United States Patent
Tsutsumi et al.

(10) Patent No.: US 11,888,053 B2
(45) Date of Patent: Jan. 30, 2024

(54) FIELD-EFFECT TRANSISTOR AND MANUFACTURING METHOD THEREFOR

(71) Applicant: Nippon Telegraph and Telephone Corporation, Tokyo (JP)

(72) Inventors: Takuya Tsutsumi, Tokyo (JP); Hideaki Matsuzaki, Tokyo (JP)

(73) Assignee: Nippon Telegraph and Telephone Corporation, Tokyo (JP)

(*) Notice: Subject to any disclaimer, the term of this patent is extended or adjusted under 35 U.S.C. 154(b) by 531 days.

(21) Appl. No.: 17/280,499

(22) PCT Filed: Oct. 16, 2019

(86) PCT No.: PCT/JP2019/040629
§ 371 (c)(1),
(2) Date: Mar. 26, 2021

(87) PCT Pub. No.: WO2020/090467
PCT Pub. Date: May 7, 2020

(65) Prior Publication Data
US 2021/0359119 A1    Nov. 18, 2021

(30) Foreign Application Priority Data
Oct. 31, 2018    (JP) ................................ 2018-204826

(51) Int. Cl.
*H01L 29/778*    (2006.01)
*H01L 21/285*    (2006.01)
(Continued)

(52) U.S. Cl.
CPC .... *H01L 29/7786* (2013.01); *H01L 21/28581* (2013.01); *H01L 29/205* (2013.01); *H01L 29/42316* (2013.01); *H01L 29/66462* (2013.01)

(58) Field of Classification Search
CPC .......... H01L 29/7786; H01L 21/28581; H01L 29/205; H01L 29/42316; H01L 29/66462;
(Continued)

(56) References Cited

U.S. PATENT DOCUMENTS

2013/0075698 A1    3/2013    Endoh et al.

FOREIGN PATENT DOCUMENTS

| JP | H05335341 A | 12/1993 |
|----|-------------|---------|
| JP | 2002184786 A | 6/2002 |

(Continued)

*Primary Examiner* — Samuel Park
(74) *Attorney, Agent, or Firm* — Slater Matsil, LLP

(57) ABSTRACT

A gate opening portion, which is disposed within a recess formation region in a state where the distance from a drain electrode is greater than the distance from a source electrode, is formed in an insulating layer. The gate opening portion is a stripe-shaped opening that extends in a gate width direction. Also, a plurality of asymmetric recess-forming opening portions are formed, arranged in a row in the gate width direction between the gate opening portion and the drain electrode within the recess formation region in the insulating layer. In this step, asymmetric recess-forming opening portions are formed whose opening size in the gate length direction is greater than the opening size in the gate width direction.

14 Claims, 12 Drawing Sheets

(51) Int. Cl.
  *H01L 29/205* (2006.01)
  *H01L 29/423* (2006.01)
  *H01L 29/66* (2006.01)

(58) Field of Classification Search
  CPC ........... H01L 21/28587; H01L 29/4236; H01L 29/402; H01L 29/0649; H01L 29/7787; H01L 29/20
  See application file for complete search history.

(56) References Cited

FOREIGN PATENT DOCUMENTS

| JP | 2003059944 A | * | 2/2003 |
| JP | 3715557 B2 | | 11/2005 |
| JP | 2013074042 A | | 4/2013 |

\* cited by examiner

FIELD-EFFECT TRANSISTOR AND MANUFACTURING METHOD THEREFOR

CROSS-REFERENCE TO RELATED APPLICATIONS

This application is a national phase entry of PCT Application No. PCT/JP2019/040629, filed on Oct. 16, 2019, which claims priority to Japanese Application No. 2018-204826, filed on Oct. 31, 2018, which applications are hereby incorporated herein by reference.

TECHNICAL FIELD

The present invention relates to a field-effect transistor and a method for manufacturing the same.

BACKGROUND

The properties of terahertz waves in an electromagnetic wave frequency band from 0.3 to 3.0 THz have the potential to create new and unprecedented applications, such as high-speed wireless communications at a speed faster than several ten Gb/s, non-destructive internal inspection using 3D imaging, and compositional analysis using electromagnetic absorption.

To realize terahertz-wave applications, electronic devices that constitute these applications are also required to have better high-frequency characteristics. Commonly, field-effect transistors made of compound semiconductors with particularly high electron mobility in terms of physical properties are used as electronic devices with good high-frequency characteristics.

Field-effect transistors may be required to have good high-frequency characteristics, but are also required to have low noise. For example, in reception-amplification units for satellite broadcasting and radio observation, low noise is required more significantly. In addition, for use such as a millimeter-wave transmitter, high output capacity to significantly amplify high-frequency signals is required. That is to say, it is important that field-effect transistors are optimally designed in accordance with the application and design concept to be used. The aforementioned requirements for field-effect transistors are particularly important in the scene of monolithic integration, which aims to integrate a variety of functions into a single integrated circuit and achieve high functionality.

For further development of terahertz wave technologies, realization of field-effect transistors with better high-frequency characteristics, as well as a technology for integrating field-effect transistors that meet various requirements, such as low noise and high output capacity, into one integrated circuit are needed hereafter.

The aforementioned field-effect transistor is constituted by a semiconductor substrate, a stacked semiconductor structure formed on the semiconductor substrate, a gate electrode formed on a surface of the stacked semiconductor structure, and source and drain electrodes formed on respective sides of the gate electrode. In particular, in a high electron mobility transistor that has excellent high-frequency characteristics, the stacked semiconductor structure is constituted by a buffer layer, a channel layer, a barrier layer, a carrier supply layer, a passivation layer and an ohmic cap layer that are sequentially stacked from the semiconductor substrate side.

In this type of field-effect transistor, when a potential is applied to the gate electrode, the concentration of two-dimensional electron gas, which is formed due to carriers being supplied from the carrier supply layer to the channel layer, is modulated in accordance with the intensity of the applied potential, and electrons move through a conduction channel formed between the source and drain electrodes. The channel layer, in which the conduction channel through which the electrons (carriers) move (travel) is formed, and the electron supply layer are spatially separated from each other, and scattering due to impurities in the electron supply layer is suppressed. Therefore, the aforementioned field-effect transistor can improve the electron mobility and realize high-frequency operation.

To improve the high-frequency characteristics of field-effect transistors, it is important to reduce drain conductance and source resistance at the same time. To reduce the drain conductance, suppressing the short channel effect or depletion of a drain region is effective. Employment of a recess structure is an effective way to achieve this depletion. The recess structure refers to a structure in which the ohmic cap layer around a gate electrode, including a gate electrode formation area, is removed in two directions, namely a direction toward the source electrode and a direction toward the drain electrode.

It is known that a structure called an asymmetric recess structure, such as that described in PTL 1, can be employed to reduce the drain conductance of field-effect transistors. In the asymmetric recess structure, as described in PTL 1, the drain conductance is reduced by increasing the length of the gate length direction of a recess region on the drain electrode side in the gate length direction compared to the source electrode side and depleting carriers over a large region on the drain electrode side when forming the recess region (see FIG. 4). With this configuration, the length of the recess region in the gate length direction on the source electrode side is shorter, and thus, depletion on the source electrode side can be avoided, and the source resistance can be reduced at the same time. These two effects can improve the high-frequency characteristics of the field-effect transistor.

CITATION LIST

Patent Literature

PTL 1 Japanese Patent No. 3715557

SUMMARY

Technical Problem

Conceivable methods of controlling the amount of etching performed to form an asymmetric recess may include adjusting the etching time, separately performing recess processes with a gate opening portion and an asymmetric recess-forming opening portion, increasing the area of the asymmetric recess-forming opening portion, increasing the number of asymmetric recess-forming opening portions, and so on. However, these methods have problems in terms of flexible setting of the amount of etching.

Firstly, in the case of adjusting the etching time, a drain-side recess region cannot be selectively etched to a larger size, and a source-side recess region, in which the amount of etching is to be reduced, cannot be made smaller than the drain-side recess region.

In the method in which the recess processes with the gate opening portions and the asymmetric recess-forming opening portion are performed separately, the semiconductor fabrication process is complicated due to the increase in the number of steps. In addition, in this method, the barrier layer, which is exposed in the recess region, is exposed to the etching process a plurality of times, resulting in degradation of the properties.

In the case of increasing the area of the asymmetric recess-forming opening portion, there may be cases where a metal that is subsequently deposited after the recess region is formed and is to serve as a gate electrode is further deposited onto the barrier layer of the recess region through the asymmetric recess-forming opening portion. To reduce parasitic capacitance and suppress distortion of the field distribution, it is important that an insulating film is deposited or a cavity where nothing is present is formed on the barrier layer in the recess region. However, if the metal is deposited on the barrier layer in the recess region, the parasitic capacitance increases, and there is a concern that the operating speed will be degraded due to an increase in the effective gate length.

Meanwhile, as described in PTL 1, an increase in the number of asymmetric recess-forming opening portions can downsize the asymmetric recess-forming opening portions and prevent unnecessary metal deposition on the barrier layer in the recess region. However, in the technique described in PTL 1, the asymmetric recess width is determined by the number of rows of asymmetric recess-forming opening portions. In this case, the amount of asymmetric etching is determined by a multiple of the number of rows of asymmetric recess-forming opening portions. Since the area of each asymmetric recess-forming opening portion is already sufficiently small, there is no adjustment flexibility. Moreover, the space between the rows of the asymmetric recess-forming opening portions cannot be reduced beyond a certain level due to resolution limitations of electron beam lithography or photolithography during resist patterning.

That is to say, the conventional techniques have a problem in that the design flexibility of field-effect transistors with the asymmetric recess structure is low. This also causes a problem in that, for example, integration of field-effect transistors with different characteristics on the same substrate cannot be readily realized.

Embodiments of the present invention have been made in view of the foregoing problems, and aims to enable the asymmetric recess structure of a field-effect transistor to be formed with higher design flexibility.

Means for Solving the Problem

A method for manufacturing a field-effect transistor according to embodiments of the present invention includes: a first step of forming a buffer layer, a channel layer, a barrier layer, a carrier supply layer, and an ohmic cap layer on a semiconductor substrate; a second step of forming a source electrode and a drain electrode, with a recess formation region therebetween, on the ohmic cap layer; a third step of forming an insulating layer on the ohmic cap layer between the source electrode and the drain electrode; a fourth step of forming, in the insulating layer, a gate opening portion disposed within the recess formation region in a state where a distance from the drain electrode is greater than a distance from the source electrode; a fifth step of forming a plurality of asymmetric recess-forming opening portions, which are arranged in a row in a gate width direction between the gate opening portion and the drain electrode within the recess formation region of the insulating layer, an opening size of the asymmetric recess-forming opening portions in a gate length direction being greater than an opening size thereof in the gate width direction; a sixth step of etching the ohmic cap layer using, as a mask, the insulating layer in which the gate opening portion and the asymmetric recess-forming opening portions are formed, and forming a recess region in a region below the gate opening portion and the asymmetric recess-forming opening portions; and a seventh step of forming a gate electrode that is disposed on the insulating layer and is partially fitted into the recess region from the gate opening portion and joined to the barrier layer through Schottky junction, wherein, in the sixth step, an amount of etching of the ohmic cap layer on the drain electrode side relative to the gate opening portion is controlled based on an opening size of each of the plurality of asymmetric recess-forming opening portions in the gate length direction.

In an example configuration of the above-described method for manufacturing a field-effect transistor, an eighth step of forming an upper insulating layer on the insulating layer and a ninth step of forming, in the upper insulating layer, an upper gate opening portion that is continuous with the gate opening portion formed in the insulating layer are further included, wherein, in the seventh step, a gate electrode is formed that is disposed on the insulating layer and is partially fitted into the recess region from the upper gate opening portion and the gate opening portion and joined to the barrier layer through Schottky junction.

In an example configuration of the above-described method for manufacturing a field-effect transistor, in the second step, in a first recess formation region and a second recess formation region disposed in different regions, a first source electrode and a first drain electrode are formed, with the first recess formation region therebetween, on the ohmic cap layer, and a second source electrode and a second drain electrode are formed, with the second recess formation region therebetween, on the ohmic cap layer. In the third step, the insulating layer is formed on the ohmic cap layer between the first source electrode and the first drain electrode, and on the ohmic cap layer between the second source electrode and the second drain electrode. In the fourth step, a first gate opening portion and a second gate opening portion are formed in the insulating layer, the first gate opening portion being disposed within the first recess formation region in a state where a distance from the first drain electrode is greater than a distance from the first source electrode, the second gate opening portion being disposed within the second recess formation region in a state where a distance from the second drain electrode is greater than a distance from the second source electrode. In the fifth step, a plurality of first asymmetric recess-forming opening portions are formed between the first gate opening portion and the first drain electrode within the first recess formation region of the insulating layer, an opening size of the first asymmetric recess-forming opening portions in the gate length direction being greater than an opening size thereof in the gate width direction, and a plurality of second asymmetric recess-forming opening portions are formed between the second gate opening portion and the second drain electrode within the second recess formation region of the insulating layer, an opening portion of the second asymmetric recess-forming opening portions in the gate length direction being greater than an opening size thereof in the gate width direction. In the sixth step, the ohmic cap layer is etched using, as a mask, the insulating layer in which the first gate opening portion and the first asymmetric recess-forming opening portions are formed, a first recess region is formed in a region below the first gate opening portion and the first asymmetric recess-forming opening portions, the ohmic cap layer is etched using, as a mask, the insulating layer in which the second gate opening portion and the second asymmetric recess-forming opening portions are formed, and a second recess region is formed in a region below the second gate opening portion and the second asymmetric recess-forming opening portions. In the seventh step, a first gate electrode is formed that is disposed on the insulating layer and is partially fitted into the first recess region from the first gate opening portion and joined to the barrier layer through Schottky junction, and a second gate electrode is formed that is disposed on the insulating layer and is partially fitted into the second recess region from the second gate opening portion and joined to the barrier layer through Schottky junction. In the fifth step, the opening size of the first asymmetric recess-forming opening portions in the gate length direction is made different from the opening size of the second asymmetric recess-forming opening portions in the gate length direction.

A field-effect transistor according to embodiments of the present invention includes: a buffer layer, a channel layer, a barrier layer, a carrier supply layer, and an ohmic cap layer formed on a semiconductor substrate; a recess region formed in the ohmic cap layer; a source electrode and a drain electrode formed, with the recess region therebetween, on the ohmic cap layer; an insulating layer formed on the ohmic cap layer and spanning the recess region; a gate opening portion formed in the insulating layer and disposed within the recess region in a state where a distance from the drain electrode is greater than a distance from the source electrode; a plurality of asymmetric recess-forming opening portions disposed within the recess region of the insulating layer and formed between the gate opening portion and the drain electrode; and a gate electrode that is formed on the insulating layer and is partially fitted into the recess region from the gate opening portion and joined to the barrier layer through Schottky junction, wherein each of the plurality of asymmetric recess-forming opening portions is formed such that an opening size thereof in a gate length direction is greater than an opening size thereof in a gate width direction.

In an example configuration of the above-described field-effect transistor, an upper insulating layer formed on the insulating layer and an upper gate opening portion that is formed in the upper insulating layer and is continuous with the gate opening portion formed in the insulating layer are further included, wherein the gate electrode is partially fitted into the recess region from the upper gate opening portion and the gate opening portion and joined to the barrier layer through Schottky junction.

In an example configuration of the above-described field-effect transistor, a first recess formation region and a second recess formation region disposed in different regions are further included. A first source electrode and a first drain electrode are formed, with the first recess formation region therebetween, on the ohmic cap layer. A second source electrode and a second drain electrode are formed, with the second recess formation region therebetween, on the ohmic cap layer. The insulating layer is formed on the ohmic cap layer between the first source electrode and the first drain electrode, and on the ohmic cap layer between the second source electrode and the second drain electrode. A first gate opening portion and a second gate opening portion are formed in the insulating layer, the first gate opening portion being disposed within the first recess formation region in a state where a distance from the first drain electrode is greater than a distance from the first source electrode, the second gate opening portion being disposed within the second recess formation region in a state where a distance from the second drain electrode is greater than a distance from the second source electrode. A plurality of first asymmetric recess-forming opening portions are formed between the first gate opening portion and the first drain electrode within the first recess formation region of the insulating layer, an opening portion of the first asymmetric recess-forming opening portions in the gate length direction being greater than an opening size thereof in the gate width direction. A plurality of second asymmetric recess-forming opening portions are formed between the second gate opening portion and the second drain electrode within the second recess formation region of the insulating layer, an opening portion of the second asymmetric recess-forming opening portions in the gate length direction being greater than an opening size thereof in the gate width direction. A first recess region is formed in a region below the first gate opening portion and the first asymmetric recess-forming opening portions. A second recess region is formed in a region below the second gate opening portion and the second asymmetric recess-forming opening portions. A first gate electrode is formed that is disposed on the insulating layer and is partially fitted into the first recess region from the first gate opening portion and joined to the barrier layer through Schottky junction. A second gate electrode is formed that is disposed on the insulating layer and is partially fitted into the second recess region from the first gate opening portion and joined to the barrier layer through Schottky junction. The opening size of the first asymmetric recess-forming opening portions in the gate length direction is made different from the opening size of the second asymmetric recess-forming opening portions in the gate length direction.

Effects of Embodiments of the Invention

As described above, according to embodiments of the present invention, a plurality of asymmetric recess-forming opening portions whose opening size in the gate length direction being greater than the opening size in the gate width direction are formed, arranged in a row in the gate width direction between the gate opening portion and the drain electrode in the recess formation region of the insulating layer, and it is therefore possible to achieve an excellent effect of enabling the asymmetric recess structure of the field-effect transistor to be formed with higher design flexibility.

DETAILED DESCRIPTION OF ILLUSTRATIVE EMBODIMENTS

Hereinafter, a method for manufacturing a field-effect transistor according to the embodiment of the present invention will be described with reference to FIGS. 1A to 1I.

Figure 1A:
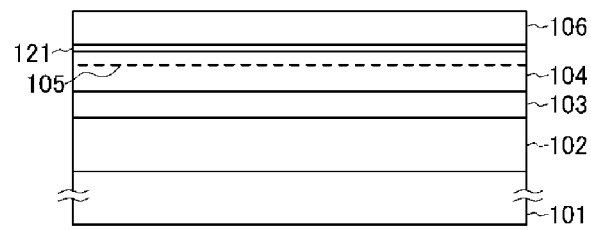
FIG. 1A is a cross-sectional view of a field-effect transistor, showing a state in an intermediate step in the manufacturing of a field-effect transistor according to an embodiment of the present invention.

First, as shown in FIG. 1A, a buffer layer 102, a channel layer 103, a barrier layer 104, a carrier supply layer 105, and an ohmic cap layer 106 are formed on a semiconductor substrate 101, which is made of semi-insulating InP, for example (first step).

For example, the buffer layer 102 made of InAlAs with a layer thickness of 100 to 300 nm, the channel layer 103 made of InGaAs with a layer thickness of 5 to 20 nm, the barrier layer 104 made of InAlAs with a layer thickness of 5 to 20 nm, and the ohmic cap layer 106 made of InGaAs that is doped with Si at $1 \times 10^{19}$ to $2 \times 10^{19}$ cm$^{-3}$ are sequentially stacked on the semiconductor substrate 101 by growing crystals by means of an organometallic vapor phase growth method, a molecular beam epitaxy method, or the like. The carrier supply layer 105, which is doped with Si as an impurity at $1 \times 10^{19}$ cm$^{-3}$ by means of well-known sheet doping, is formed on the barrier layer 104. Here, in the embodiment, a passivation layer 121 made of InP with a layer thickness of 2 to 5 nm is formed between the carrier supply layer 105 and the ohmic cap layer 106.

Figure 1B:
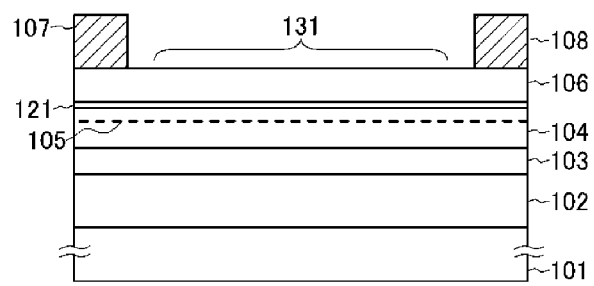
FIG. 1B is a cross-sectional view of the field-effect transistor, showing a state in an intermediate step in the manufacturing of the field-effect transistor according to the embodiment of the present invention.

Next, as shown in FIG. 1B, a source electrode 107 and a drain electrode 108 are formed, with a recess formation region 131 for forming a recess region therebetween, on the ohmic cap layer 106 (second step). For example, Ti/Pt/Au is deposited and a metal film is formed on the ohmic cap layer 106, and the source electrode 107 and the drain electrode 108 are formed by patterning this metal film by means of a known photolithographic technique and etching technique. Alternatively, the source electrode 107 and the drain electrode 108 can be formed by means of a known lift-off method. The source electrode 107 and the drain electrode 108 are joined to the ohmic cap layer 106 through ohmic junction.

Figure 1C:
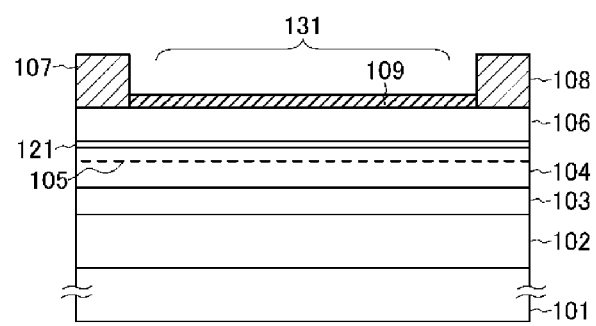
FIG. 1C is a cross-sectional view of the field-effect transistor, showing a state in an intermediate step in the manufacturing of the field-effect transistor according to the embodiment of the present invention.

Next, as shown in FIG. 1C, an insulating layer 109 is formed on the ohmic cap layer 106 between the source electrode 107 and the drain electrode 108 (third step). For example, the insulating layer 109 with a layer thickness 20 to 200 nm is formed by depositing silicon oxide or silicon nitride by means of a well-known plasma CVD method or the like.

Figure 1D:
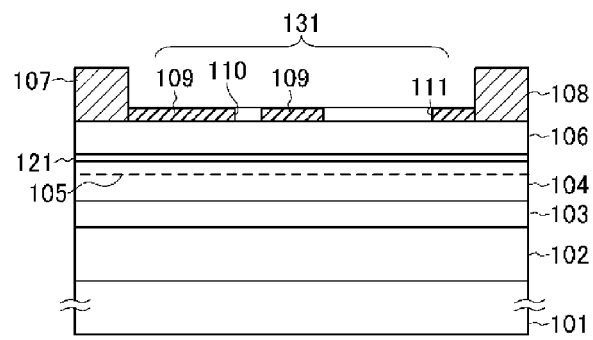
FIG. 1D is a cross-sectional view of the field-effect transistor, showing a state in an intermediate step in the manufacturing of the field-effect transistor according to the embodiment of the present invention.
Figure 1E:
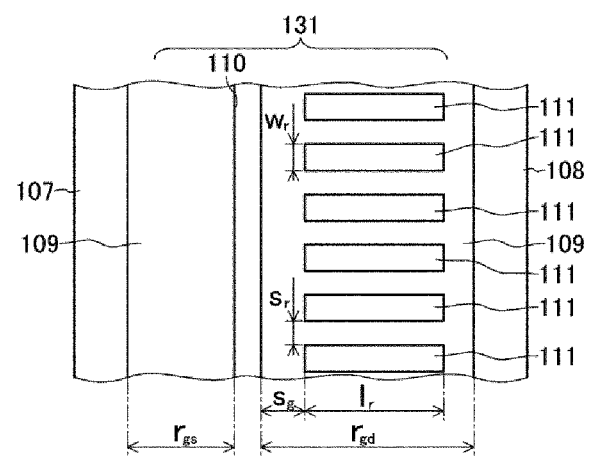
FIG. 1E is a plan view showing a state in an intermediate step in the manufacturing of the field-effect transistor according to the embodiment of the present invention.

Next, as shown in FIGS. 1D and 1E, a gate opening portion 110, which is disposed within the recess formation region 131 in a state where the distance from the drain electrode 108 is greater than the distance from the source electrode 107, is formed in the insulating layer 109 (fourth step). The gate opening portion 110 is a stripe-shaped opening that extends in a gate width direction (normal direction of the paper plane of FIG. 1D). Also, a plurality of asymmetric recess-forming opening portions 111 are formed, arranged in a row in the gate width direction between the gate opening portion 110 and the drain electrode 108 within the recess formation region 131 of the insulating layer 109 (fifth step). In this step, asymmetric recess-forming opening portions 111 are formed whose opening size in the gate length direction is greater than the opening size in the gate width direction. For example, the gate opening portion 110 and the asymmetric recess-forming opening portions 111 are formed by means of a known electron beam lithography technique and etching technique.

For example, the plurality of asymmetric recess-forming opening portions 111 can be formed to have the same shape. Also, for example, the plurality of asymmetric recess-forming opening portions 111 can be formed so as to be disposed parallel to the gate width direction.

Figure 1F:
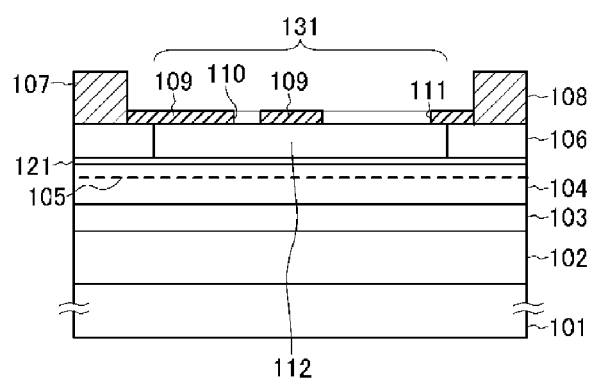
FIG. 1F is a cross-sectional view of the field-effect transistor, showing a state in an intermediate step in the manufacturing of the field-effect transistor according to the embodiment of the present invention.

Next, as shown in FIG. 1F, the ohmic cap layer 106 is etched using, as a mask, the insulating layer 109 in which the gate opening portion 110 and the plurality of asymmetric recess-forming opening portions 111 are formed, and a recess region 112, in which a surface of the passivation layer 121 or the barrier layer 104 is continuously exposed, is formed in a region below the gate opening portion 110 and the plurality of asymmetric recess-forming opening portions 111 (sixth step).

For example, an etchant is put into the aforementioned opening regions and the ohmic cap layer 106 is isotopically etched by means of wet etching using an etchant such as citric acid. Through this etching, the etchant erodes the ohmic cap layer 106 from the opening portions, and forms the recess region 112, which is one connected space, due to lateral spread of the etching. If the passivation layer 121 made of InP is formed, InP is hardly etched by the citric acid-based etchant and can thus serve as an etch stopper and prevent the barrier layer 104 from being etched.

In the aforementioned formation of the recess region 112, when the gate length direction is viewed with the gate opening portion 110 at the center, the space formed on the drain side from the gate opening portion 110 is wider than the space formed on the source side from the gate opening portion 110 since the asymmetric recess-forming opening portions 111 are formed. By thus providing the plurality of asymmetric recess-forming opening portions 111, an asymmetric recess region with the gate opening portion 110 at the center is formed without adding a new step.

Here, in the aforementioned step (sixth step), the amount of etching the ohmic cap layer 106 on the drain electrode 108 side of the gate opening portion 110 is controlled based on the opening size in the gate length direction of each of the plurality of asymmetric recess-forming opening portions 111. Thus, the shape of the asymmetric recess (the size of the space formed on the drain side of the gate opening portion 110) is controlled. This point will be described in more detail using FIGS. 1E and 1F.

Note that, in the following description, the lengths in the gate length direction from the gate opening portion 110 on the source side and the drain side in the recess region 112 will be referred to as "recess widths". For example, a "source-side recess width $r_{gs}$" refers to the length in the gate length direction from the gate opening portion 110 on the source side in the recess region 112. A "drain-side recess width $r_{gd}$" refers to the length in the gate length direction from the gate opening portion 110 on the drain side in the recess region 112.

The asymmetric recess-forming opening portions 111 are formed, arranged in the gate width direction between the gate opening portion 110 and the drain electrode 108. The opening size $l_r$ of the asymmetric recess-forming opening portions 111 in the gate length direction, the opening size $w_r$ in the gate width direction, and the gap $s_r$ between adjacent asymmetric recess-forming opening portions 111 are determined in accordance with the amount of etching of the ohmic cap layer 106 for obtaining a target recess width $r_{gs}$ and recess width $r_{gd}$.

The asymmetric recess-forming opening portions 111 are only formed in one row in order to ensure the strength of the insulating layer 109, and is not formed in a plurality of rows as in PTL 1. Basically, the lower the source resistance is, the more desirable it is, and since there is a concern that the formation of a recess may increase the source resistance due to depletion, the asymmetric recess-forming opening portions are not formed on the source electrode side. Note that $s_g$ denotes the distance from the gate opening portion 110 to the asymmetric recess-forming opening portions 111.

A relationship expressed as "$r_{gd}-r_{gs}=(s_g+l_r) \ldots$ (1)" is established for the aforementioned $r_{gd}$, $r_{gs}$, $s_g$, and $l_r$. However, to avoid recess etching residue, it is assumed that constraint conditions expressed as "$r_{gd} \geq s_g \ldots$ (2)" and "$r_{gd} \geq 0.5 s_r \ldots$ (3)" are satisfied.

By establishing the aforementioned relationships, an asymmetric recess structure can be formed without depending on the etching rate and etching time of wet etching that are required to form an asymmetric recess. The etching rate $\alpha$ and the etching time T in the case of forming an asymmetric recess structure aimed at satisfying the aforementioned relationships and constraint conditions is determined by "$r_{gs}=\alpha T \ldots$ (4)".

The etching amounts in the source electrode-side recess region and the drain electrode-side recess region are designed based on the balance between the effect of increasing the parasitic resistance and the effect of reducing the parasitic capacitance and the drain conductance. For example, a typical recess width is 20 to 200 nm on the source electrode side, and is 50 to 500 nm on the drain electrode side. By forming the recess regions in this range, the drain conductance can be sufficiently reduced while sufficiently reducing the source resistance, and an asymmetric recess structure optimal for improving high-frequency characteristics can be realized.

For example, the case is considered where the asymmetric recess width is designed as $r_{gs}$=50 nm on the source electrode side, and as $r_{gd}$=200 nm on the drain electrode side. Under this condition, the left side of Formula (1) is 150 nm, and thus, the asymmetric recess-forming opening portions 111 are formed in the insulating layer 109 with $s_g$=20 nm and $l_r$=130 nm, for example. As for the wet etching time required to form an asymmetric recess, if, for example, the etching rate is 50 nm/min., an etching time of 60 sec. is employed, giving consideration to Formula (3).

Figure 1G:
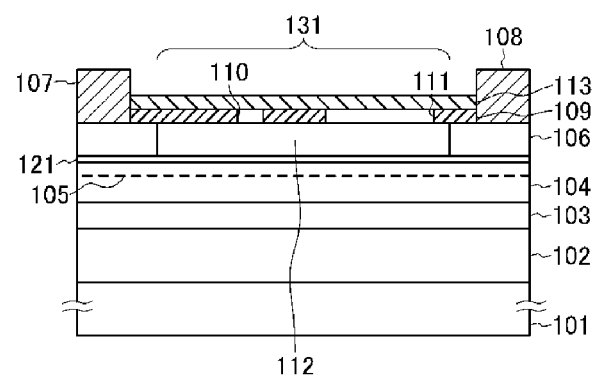
FIG. 1G is a cross-sectional view of the field-effect transistor, showing a state in an intermediate step in the manufacturing of the field-effect transistor according to the embodiment of the present invention.

Next, as shown in FIG. 1G, an upper insulating layer 113 is formed on the insulating layer 109 (eighth step). For example, the upper insulating layer 113 with a layer thickness of 20 to 200 nm is formed by depositing silicon oxide or silicon nitride by means of a plasma CVD method or the like.

Figure 1H:
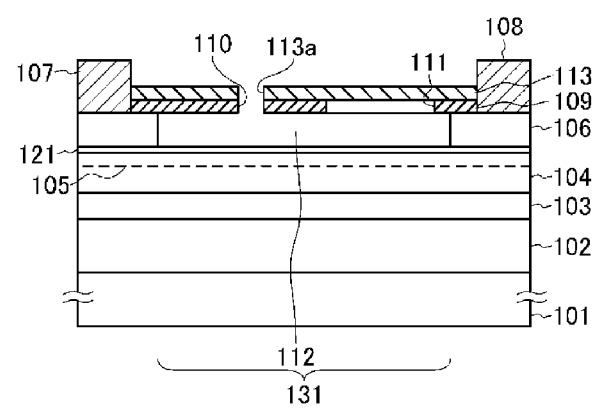
FIG. 1H is a cross-sectional view of the field-effect transistor, showing a state in an intermediate step in the manufacturing of the field-effect transistor according to the embodiment of the present invention.

Next, as shown in FIG. 1H, an upper gate opening portion 113a, which is continuous with the gate opening portion 110 formed in the insulating layer 109, is formed in the upper insulating layer 113 (ninth step). For example, the upper gate opening portion 113a is formed by means of a known electron beam lithography technique and etching technique. Since the upper gate opening portion 113a is formed in the upper insulating layer 113, when the upper gate opening portion 113a is formed, etching is performed to an extent that the upper gate opening portion 113a is penetrated. Thus, a fine upper gate opening portion 113a can be formed.

Figure 1I:
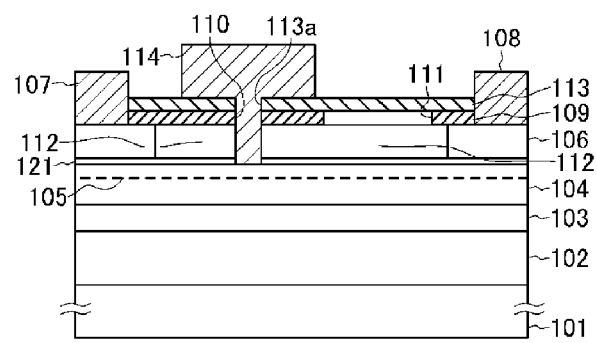
FIG. 1I is a cross-sectional view of the field-effect transistor, showing a state in an intermediate step in the manufacturing of the field-effect transistor according to the embodiment of the present invention.

Next, as shown in FIG. 1I, a gate electrode 114 is formed that is disposed on the insulating layer 109 (upper insulating layer 113) and is partially fitted into the recess region 112 from the gate opening portion 110 and joined to the barrier layer 104 through Schottky junction (seventh step).

For example, a lift-off mask is formed in which a predetermined region of the upper insulating layer 113 including the gate opening portion 110 is opened, and the other region including the source electrode 107 and the drain electrode 108 is covered. Next, a gate metal material is deposited from above this lift-off mask to form a metal film, and then the lift-off mask is removed (lifted off). The gate electrode 114 can be formed by this lift-off method. When the aforementioned metal film is formed, the metal that is deposited and enters the gate opening portion 110 passes through the extremely-thin passivation layer 121 and is joined to the barrier layer 104 through Schottky junction, which can be seen from the gate opening portion 110. As mentioned above, since a fine upper gate opening portion 113a (gate opening portion 110) can be formed, a gate electrode 114 with a fine size of Schottky junction in the gate length direction can be realized, and excellent high-frequency characteristics can be realized.

A function of modulating a channel immediately below the Schottky junction is provided by a potential applied to the gate electrode 114 that forms the Schottky junction together with the barrier layer 104. The size (gate length) and the shape of the gate electrode 114 is designed such that parasitic capacitance does not occur between the gate electrode 114 and the source electrode 107 and between the gate electrode 114 and the drain electrode 108, and such that the resistance of the entire gate electrode 114 is sufficiently low.

The gate electrode 114 is made of a metal material with little thermal diffusion with respect to the semiconductor substrate 101 and a large work function, such as Ni, W, or WSiN. These metal materials can be deposited using a sputtering method, a vacuum vapor deposition method, an electroless plating method, an electrolytic plating method, or the like. The length (gate length) of the gate electrode 114 in a contact surface between the gate electrode 114 and the barrier layer 104 is typically 10 to 100 nm.

The distance from an end of the gate electrode 114 to an end of the source electrode 107 in the contact surface between the gate electrode 114 and the barrier layer 104 is at least equal to the source-side recess width or more, and the distance from the gate electrode 114 to an end of the drain electrode 108 is at least equal to the drain-side recess width or more. In particular, to obtain more favorable output characteristics of the transistor, the distance from the gate electrode 114 to the end of the drain electrode 108 can be made longer than the distance from the gate electrode 114 to the end of the source electrode 107.

In the above description, the upper insulating layer 113 is formed after the asymmetric recess-forming opening portions 111 are formed in the insulating layer 109, but this need not be the case. For example, it is also possible to form the upper insulating layer 113 following the formation of the insulating layer 109, and then form the gate opening portion 110 and the asymmetric recess-forming opening portions 111. For example, the asymmetric recess-forming opening portions 111 are formed to pass through the upper insulating layer 113 and the insulating layer 109, thereafter the recess region 112 is formed, and the gate electrode 114 is formed. In this case, a metal layer is formed in the asymmetric recess-forming opening portions 111 when the gate electrode 114 is formed.

Figure 2:
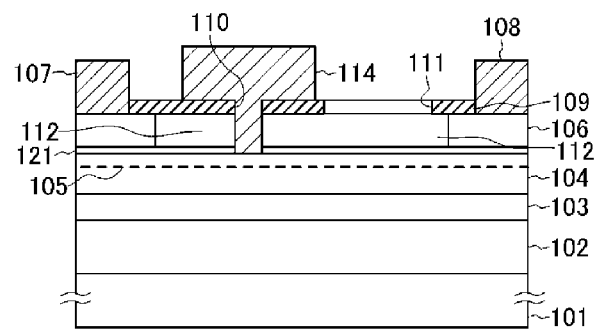
FIG. 2 is a cross-sectional view showing a configuration of another field-effect transistor according to the embodiment of the present invention.

Alternatively, after the recess region 112 is formed using the insulating layer 109, the gate electrode 114 can be formed without forming the upper insulating layer 113 (see FIG. 2). In this case as well, a metal layer is formed in the asymmetric recess-forming opening portions 111 when the gate electrode 114 is formed. Here, by forming the asymmetric recess-forming opening portions 111 with a width $w_r$ of 50 nm or less, for example, and forming the gate electrode 114 using a sputtering method, deposition of the metal on the barrier layer 104 and the passivation layer 121 via the asymmetric recess-forming opening portions 111 can be suppressed.

Figure 3:
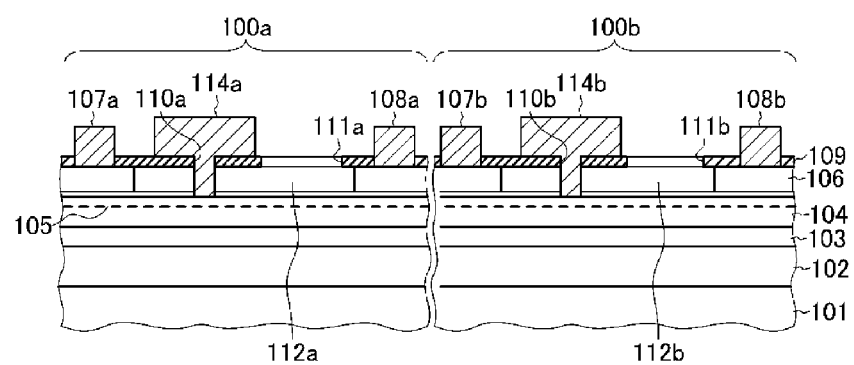
FIG. 3 is a cross-sectional view showing a configuration of another field-effect transistor according to the embodiment of the present invention.
Figure 4:
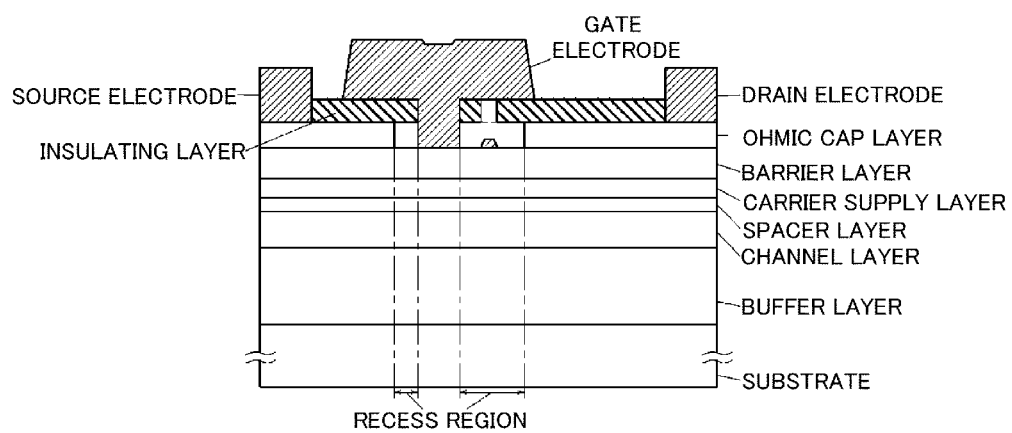
FIG. 4 is a cross-sectional view showing a configuration of a field-effect transistor disclosed in PTL 1.

According to the above-described method for manufacturing a field-effect transistor of embodiments of the present invention, as shown in FIG. 3, a first field-effect transistor 100a and a second field-effect transistor 100b that have different source resistance and drain conductance can be integrated on the semiconductor substrate 101.

First, in the second step described using FIG. 1B, in a first recess formation region 112a and a second recess formation region 112b that are disposed in different regions, a first source electrode 107a and a first drain electrode 108a are formed on the ohmic cap layer 106 with the first recess formation region 112a therebetween. Also, a second source electrode 107b and a second drain electrode 108b are formed on the ohmic cap layer 106 with the second recess formation region 112b therebetween.

Next, in the third step described using FIG. 1C, insulating layers 109 are formed on the ohmic cap layer 106 between the first source electrode 107a and the first drain electrode 108a, and on the ohmic cap layer 106 between the second source electrode 107b and the second drain electrode 108b.

Next, in the fourth step described using FIGS. 1D and 1E, a first gate opening portion 110a, which is disposed within the first recess formation region 112a in a state where the distance from the first drain electrode 108a is greater than the distance from the first source electrode 107a, and a second gate opening portion 110b, which is disposed within the second recess formation region 112b in a state where the distance from the second drain electrode 108b is greater than the distance from the second source electrode 107b, are formed in the insulating layer 109.

Next, in the fifth step, a plurality of first asymmetric recess-forming opening portions 111a, whose opening size in the gate length direction is greater than the opening size in the gate width direction, are formed between the first gate opening portion 110a and the first drain electrode 108a within the first recess formation region 112a of the insulating layer 109. Also, a plurality of second asymmetric recess-forming opening portions 111b, whose opening size in the gate length direction is greater than the opening size in the gate width direction, are formed between the second gate opening portion 110b and the second drain electrode 108b within the second recess formation region 112b of the insulating layer 109.

In the fifth step, the opening size of the first asymmetric recess-forming opening portions 111a in the gate length direction is made different from the opening size of the second asymmetric recess-forming opening portions 111b in the gate length direction. For example, the first asymmetric recess-forming opening portions 111a are made such that the distance $s_{g1}$ from the first gate opening portion 110a to the first asymmetric recess-forming opening portions 111a is 20 nm, and the opening size $l_{r1}$ in the gate length direction is 130 nm. The second asymmetric recess-forming opening portions 111b are made such that the distance $s_{g2}$ from the second gate opening portion 110b to the second asymmetric recess-forming opening portions 111b is 20 nm, and the opening size $l_{r2}$ in the gate length direction is 30 nm. This step can be realized by a single time of lithography step and etching step using one photo mask, for example.

Next, in the sixth step described using FIG. 1F, the ohmic cap layer 106 is etched using, as a mask, the insulating layer 109 in which the first gate opening portion 110a and the first asymmetric recess-forming opening portions 111a are formed, and a first recess region is formed in a region below the first gate opening portion 110a and the first asymmetric recess-forming opening portions 111a. Also, the ohmic cap layer 106 is etched using, as a mask, the insulating layer 109 in which the second gate opening portion 110b and the second asymmetric recess-forming opening portions 111b are formed, and a second recess region is formed in a region below the second gate opening portion nob and the second asymmetric recess-forming opening portions 111b.

In the above-described etching process, if the etching time is 60 sec. under the condition that the etching rate is 50 nm/min., the first field-effect transistor 100a has a source-side recess width $r_{gs1}$ of 50 nm and a drain-side recess width $r_{gd1}$ of 200 nm, and the second field-effect transistor 100b has a source-side recess width $r_{gs2}$ of 50 nm and a drain-side recess width $r_{gd2}$ of 100 nm.

Next, in the seventh step described using FIG. 1I, a first gate electrode 114a is formed that is disposed on the insulating layer 109 and is partially fitted into the first recess region from the first gate opening portion 110a and joined to the barrier layer through Schottky junction, and a second gate electrode 114b is formed that is disposed on the insulating layer 109 and is partially fitted into the second recess region from the second gate opening portion nob and joined to the barrier layer through Schottky junction.

As mentioned above, two field-effect transistors with different drain-side recess widths can be integrated using a simple manufacturing method that enables application of the same wet etching condition. As a result, a plurality of field-effect transistors with different characteristics can be formed on the same circuit, and thus, the flexibility in designing an integrated circuit can be remarkably improved.

As described above, according to embodiments of the present invention, a plurality of asymmetric recess-forming opening portions whose opening size in the gate length direction is greater than the opening size in the gate width direction are formed, arranged in a row in the gate width direction between the gate opening portion and the drain electrode within the recess formation region of the insulating layer. Thus, an asymmetric recess structure of a field-effect transistor can be formed with higher design flexibility.

Note that the present invention is not limited to the above-described embodiment, and it is apparent that many modifications and combinations can be carried out by those with common knowledge in this field within the technical idea of the present invention. For example, in the above description, the carrier supply layer is formed on the barrier layer by means of sheet doping. However, this need not be the case, and the carrier supply layer can alternatively be provided on the buffer layer.

REFERENCE SIGNS LIST

101 Semiconductor substrate
102 Buffer layer
103 Channel layer
104 Barrier layer
105 Carrier supply layer
106 Ohmic cap layer
107 Source electrode
108 Drain electrode
109 Insulating layer
110 Gate opening portion
111 Asymmetric recess-forming opening portion
112 Recess region
113 Upper insulating layer
113a Upper gate opening portion
114 Gate electrode
121 Passivation layer
131 Recess formation region.

The invention claimed is:

1. A method for manufacturing a field-effect transistor, comprising:
a first step of forming a buffer layer, a channel layer, a barrier layer, a carrier supply layer, and an ohmic cap layer on a semiconductor substrate;
a second step of forming a source electrode and a drain electrode on the ohmic cap layer; a third step of forming an insulating layer on the ohmic cap layer between the source electrode and the drain electrode;
a fourth step of forming, in the insulating layer, a gate opening portion, wherein the gate opening portion is spaced at a greater distance from the drain electrode than from the source electrode, wherein the drain electrode is spaced apart from the source electrode along a gate length direction;
a fifth step of forming a plurality of asymmetric recess-forming opening portions, which are arranged in a row in a gate width direction between the gate opening portion and the drain electrode within the insulating layer, a respective opening size of each of the plurality of asymmetric recess-forming opening portions in the gate length direction being greater than a respective opening size of each of the plurality of asymmetric recess-forming opening portions in the gate width direction, the gate width direction being perpendicular to the gate length direction;
a sixth step of etching the ohmic cap layer using, as a mask, the insulating layer in which the gate opening portion and the plurality of asymmetric recess-forming opening portions are formed, and forming a recess region below the gate opening portion and the plurality of asymmetric recess-forming opening portions; and
a seventh step of forming a gate electrode on the insulating layer and disposed in the recess region and in the gate opening portion, wherein the gate electrode is joined to the barrier layer through a Schottky junction, and wherein, in the sixth step, an amount of etching of the ohmic cap layer on a drain electrode side relative to the gate opening portion is controlled based on the respective opening size of each of the plurality of asymmetric recess-forming opening portions in the gate length direction.

2. The method of manufacturing the field-effect transistor according to claim 1, further comprising:
an eighth step of forming an upper insulating layer on the insulating layer; and
a ninth step of forming, in the upper insulating layer, an upper gate opening portion that is continuous with the gate opening portion in the insulating layer, wherein, in the seventh step, the gate electrode is further disposed in the upper gate opening portion.

3. The method for manufacturing the field-effect transistor according to claim 1, wherein:
in the second step, forming the source electrode comprises forming a first source electrode and a second source electrode on the ohmic cap layer, and forming the drain electrode comprises forming a first drain electrode and a second drain electrode on the ohmic cap layer;
in the third step, the insulating layer is formed on the ohmic cap layer between the first source electrode and the first drain electrode and between the second source electrode and the second drain electrode;
in the fourth step, wherein forming the gate opening portion comprises forming a first gate opening portion and a second gate opening portion are formed in the insulating layer, the first gate opening portion being disposed between the first source electrode and the first drain electrode such that a distance of the first gate opening portion from the first drain electrode is greater than a distance of the first gate opening portion from the first source electrode, the second gate opening portion being disposed between the second source electrode and the second drain electrode such that a distance of the second gate opening portion from the second drain electrode is greater than a distance of the second gate opening portion from the second source electrode;
in the fifth step, forming the plurality of asymmetric recess-forming opening portions comprises forming a plurality of first asymmetric recess-forming opening portions between the first gate opening portion and the first drain electrode within the insulating layer, an opening size of the plurality of first asymmetric recess-forming opening portions in the gate length direction being greater than an opening size the plurality of first asymmetric recess-forming opening portions in the gate width direction, and forming the plurality of asymmetric recess-forming opening portions further comprises forming a plurality of second asymmetric recess-forming opening portions between the second gate opening portion and the second drain electrode within the insulating layer, an opening portion of the plurality of second asymmetric recess-forming opening portions in the gate length direction being greater than an opening size of the plurality of second asymmetric recess-forming opening portions in the gate width direction;
in the sixth step, the ohmic cap layer is etched using, as the mask, the insulating layer to define a first recess region of the recess region below the first gate opening portion and the plurality of first asymmetric recess-forming opening portions and to define a second recess region of the recess region below the second gate opening portion and the plurality of second asymmetric recess-forming opening portions;

in the seventh step, forming the gate electrode comprises forming a first gate electrode on the insulating layer and disposed in the first recess region and the first gate opening portion and forming a second gate electrode on the insulating layer and disposed in the second recess region and the second gate opening portion; and in the fifth step, the opening size of the first asymmetric recess-forming opening portions in the gate length direction is made different from the opening size of the second asymmetric recess-forming opening portions in the gate length direction.

4. The method of manufacturing the field-effect transistor according to claim 3, wherein the first gate electrode is joined to the barrier layer through a first Schottky junction.

5. The method of manufacturing the field-effect transistor according to claim 3, wherein the second gate electrode is joined to the barrier layer through a second Schottky junction.

6. A field-effect transistor comprising:
a buffer layer, a channel layer, a barrier layer, a carrier supply layer, and an ohmic cap layer on a semiconductor substrate;
a first source electrode and a first drain electrode formed on the ohmic cap layer, wherein the first drain electrode is spaced apart from the first source electrode along a gate length direction;
an insulating layer on the ohmic cap layer between the first source electrode and the first drain electrode;
a first gate opening in the insulating layer between the first drain electrode and the first source electrode, wherein a distance of the first gate opening from the first drain electrode is greater than a distance of the first gate opening from the first source electrode;
a plurality of first asymmetric openings in the insulating layer between the first gate opening and the first drain electrode;
a first recess region below the first gate opening and the plurality of first asymmetric openings; and
a first gate electrode on the insulating layer and disposed in the first gate opening and the first recess region, wherein the first gate electrode is joined to the barrier layer through a first Schottky junction, wherein each of the plurality of first asymmetric openings is arranged such that an opening size thereof in the gate length direction is greater than an opening size thereof in a gate width direction, the gate width direction being perpendicular to the gate length direction.

7. The field-effect transistor according to claim 6, further comprising:
an upper insulating layer on the insulating layer; and
an upper gate opening in the upper insulating layer and is continuous with the first gate opening in the insulating layer, wherein the first gate electrode is further disposed in the upper gate opening of the upper insulating layer.

8. The field-effect transistor according to claim 7, wherein the upper insulating layer covers the plurality of first asymmetric openings.

9. The field-effect transistor according to claim 6, wherein the first recess region is disposed in the ohmic cap layer.

10. The field-effect transistor according to claim 6, further comprising:
a second source electrode and a second drain electrode on the ohmic cap layer, wherein the insulating layer is further disposed on the ohmic cap layer between the second source electrode and the second drain electrode;
a second gate opening in the insulating layer between the second drain electrode and the second source electrode, wherein a distance of the second gate opening from the second drain electrode is greater than a distance of the second gate opening from the second source electrode;
a plurality of second asymmetric openings in the insulating layer between the second gate opening and the second drain electrode, an opening size of the plurality of second asymmetric openings in the gate length direction being greater than an opening size of the plurality of second asymmetric openings in the gate width direction;
a second recess region below the second gate opening and the plurality of second asymmetric openings; and
a second gate electrode on the insulating layer and disposed in the second gate opening and the second recess region, wherein the second gate electrode is joined to the barrier layer through a second Schottky junction, wherein the opening size of the plurality of first asymmetric openings in the gate length direction is different from the opening size of the plurality of second asymmetric openings in the gate length direction.

11. The field-effect transistor according to claim 10, wherein the second recess region is disposed in the ohmic cap layer.

12. The field-effect transistor according to claim 6, wherein the first gate electrode extends higher than the first source electrode and the first drain electrode.

13. The field-effect transistor according to claim 6 further comprising a passivation layer between the carrier supply layer and the ohmic cap layer.

14. The field-effect transistor according to claim 13, wherein the first gate electrode extends through the passivation layer.

* * * * *